United States Patent [19]

Kirkman

[11] Patent Number: 4,533,187
[45] Date of Patent: Aug. 6, 1985

[54] DUAL BEAM CONNECTOR

[75] Inventor: Michael Kirkman, Barrington, R.I.

[73] Assignee: Augat Inc., Mansfield, Mass.

[21] Appl. No.: 455,945

[22] Filed: Jan. 6, 1983

[51] Int. Cl.³ ............................................. H01R 23/72
[52] U.S. Cl. .......................... 339/17 CF; 339/218 M; 339/258 P; 339/275 B
[58] Field of Search ............ 339/17 R, 17 C, 17 CF, 339/17 L, 17 LC, 275 B, 176 MP, 218 M, 258 R, 258 P, 258 F, 191 R, 191 M, 192, 221 R, 221 M

[56] References Cited

U.S. PATENT DOCUMENTS

| 3,555,497 | 1/1971  | Watanabe      | 339/258 R  |
| 3,685,001 | 8/1972  | Krafthefer    | 339/17 L   |
| 3,850,500 | 11/1974 | Cobaugh et al.| 339/258 R  |
| 3,992,076 | 11/1976 | Gluntz        | 339/275 B  |
| 4,192,565 | 3/1980  | Gianni        | 339/17 CF  |
| 4,220,393 | 9/1980  | Ammon et al.  | 339/221 R  |
| 4,274,699 | 6/1981  | Keim          | 339/176 MP |
| 4,410,231 | 10/1983 | Senor         | 339/218 M  |

FOREIGN PATENT DOCUMENTS 2752194  6/1979  Fed. Rep. of Germany ... 339/258 R

OTHER PUBLICATIONS

IBM Bulletin, Meiboom, vol. 5, No. 5, p. 26, 10-1962.

Primary Examiner—Neil Abrams
Attorney, Agent, or Firm—Weingarten, Schurgin, Gagnebin & Hayes

[57] ABSTRACT

A dual beam connector with contacts having opposing reverse-bend contact arms and a tab serving as a solder lug carried by the contact pin for increased soldering reliability. The connector housing in which the contacts are mounted includes standoffs which space the connector housing sufficiently above the printed circuit board to which it is mounted to permit visual inspection of the solder bond to the solder lug, to facilitate cleaning of residual flux from between the connector and printed circuit board, and to provide improved heat dissipation by providing an air channel between the connector and printed circuit board. The individual contacts are upwardly inserted, or uploaded, into the connector sockets with tab restraints at the bottom corners of the sockets being hot-pressed over portions of the contact to secure and seal the contact in its respective socket. The dual beam reverse-bend contact configuration provides a high contact point for inserted IC pins, provides better double-sided wiping action, reduces seating plane height, and prevents buckling of the contact.

1 Claim, 10 Drawing Figures

DUAL BEAM CONNECTOR

FIELD OF INVENTION

This invention relates to electrical connectors and more particularly to a connector adapted to be mounted to and spaced from a printed circuit board, with the connector including reverse-bend dual beam structure and tabs serving as solder lugs extending from the connector leads.

BACKGROUND OF THE INVENTION

Present Dual in Line (DIP) sockets include dual beam contacts for making contact to pins extending from integrated circuits (ICs). These DIP sockets are represented by two types of connectors, namely a U-shaped dual beam connector manufactured by Robertson-Nugent and a semi-dual beam connector of Amp Corporation, which has a stationary arm mounted in opposition to a reverse-bend contact arm.

In actual practice, both of these sockets are mounted directly against the printed circuit board to which they are soldered. However, one of the major disadvantages of the mounting of standard DIP socket connectors against the printed circuit board is that soldering flux deposited over the printed circuit board prior to mounting of the connector is difficult to clean out from between the two adjacent parts. Secondly, there is no air flow between the parts or very restricted air flow which limits heat dissipation. Finally, during wave soldering, it is common that the solder flows up through the through-holes in the printed circuit board and extends over the top surface of the printed circuit board at the holes. In general this is considered to be a deleterious effect of wave soldering, and the sockets heretofore have not utilized this solder outflow to advantage.

Another major problem with standard DIP sockets is the problem of the height of the socket seating plane above the circuit board to which it is mounted. One of the major factors in the selection of a socket is that the seating plane for an integrated circuit, e.g., the top surface of the socket, should be as low to the printed circuit board as possible. Note that sockets using the U-shaped contacts and the semi-dual beam contacts have seating plane heights of approximately 0.200 inches and 0.175 inches respectively. With respect to the sockets having U-shaped contacts, since the contacts have flaired-out ends, the flairing increases the overall height of the contact, and therefore the overall height of the socket. The semi-dual beam socket has this same problem with the flairing of its stationary contact arm.

Moreover, another factor is the contact depth, or the depth at which an IC pin makes contact with the dual beams or arms within the socket of a connector. The higher the contact point, the more that the inserted pin will extend into the socket. The result is more wiping action when the pin is pulled out of the socket. It will be noted that the semi-dual beam has a relatively low contact point, which limits the amount of wiping action provided by the withdrawal of the pin from the socket.

With respect to the wiping action of the aforementioned U-shaped dual beam contact, it will be appreciated that the force applied by the opposed contact arms or beams to an inserted pin is at right angles or perpendicular to the pin. This limits the scrubbing or wiping action on both sides of the pin.

While the aforementioned socket utilizing U-shaped contacts is loaded from the bottom in a so-called bottomloaded configuration, the semi-dual beam socket is toploaded, or mounted through the top surface of the socket, leaving the top of the contact exposed without protection from a restricted socket aperture. Upon insertion, if the pins from the integrated circuit are bent, they rest on the top of the contact, instead of going through the contact. Thus electrical connection is made by virtue of the pin resting on top of the contact. Because the pin rests on top of the contact and is not sitting in the contact, good electrical joints cannot be made and fail frequently during vibration.

Further with respect to the bottomloaded U-shaped contact, when the contact is mounted from the bottom in the socket of the connector, it is important that the contact be sealed from the bottom to prevent solder contamination. A wafer seal is usually provided to prevent any solder flux from entering the contact area. However, the addition of the wafer is a time-consuming process, which makes the socket more expensive to manufacture.

SUMMARY OF THE INVENTION

In order to solve the deficiencies of the aforementioned connectors and their respective contact configurations, a DIP socket connector is provided with dual beam reverse-bend contact arms. These arms are formed integral to a horizontal base, with the base having an integral contact pin depending therefrom. The pin is provided with a laterally extending tab below the base of the contact. This tab forms a solder lug for solder coming up through through-hole apertures in the printed circuit board to which the connector is soldered. An anti-overstress detent bar is provided at the free end of each contact arm to prevent damage to an inserted pin when an oversized pin or lead is inserted into the connector and is then withdrawn.

The contact is uploaded into a socket in a connector body, and it is limited in its upward travel by internal stops within the socket. Heat-deformable tabs are provided at the four corners of the bottom of the socket, with the tabs being hot-pressed over the corners of the base of the contact to secure and seal the contact to its respective socket.

The connector housing is provided with a number of standoffs which extend below the tab forming the solder lug, such that when the connector is mounted to a printed circuit board, a space is provided between the bottom of the connector housing and the top surface of the printed circuit board. The standoff spacing is made large enough to prevent the tabs from contacting the top surface of the printed circuit board to prevent bending or loading.

The spacing of the connector housing from the printed circuit board permits cleaning of any residual solder flux carried by the printed circuit board. This permits conventional acid bath to enter the space between the connector housing and the printed circuit board to remove any such flux. The spacing of the connector housing from the printed circuit board also provides an air channel for heat dissipation purposes.

More importantly, in the usual wave soldering process, solder passes up through the through-holes in the printed circuit board, around the connector leads, and onto the top surface of the printed circuit board, forming a solder bubble immediately adjacent the through-hole. While in the past this has been deemed to be a deleterious condition, with the subject connector, the bubble of solder is deposited on the tab immediately above the corresponding through-hole. This greatly increases the reliability of the electrical contact to the connector lead, and is due primarily to the increased solder contact area provided by the tab.

The spacing of the connector housing from the top surface of the printed circuit board permits ready visual inspection of the solder bonds provided by the solder bubbles. Thus quality control is enhanced by virtue of the spacing of the connector from the printed circuit board provided by the standoffs.

It should be noted that the use of spacers is permitted due to the use of the subject reverse-bend dual beam contact, because of its reduced contact height. Thus even with spacers, the seating height is kept to a minimum due to the low profile reverse-bend dual beam structure. This combination affords connector standoff while at the same matching the contact height of the thinnest prior art DIP socket.

As mentioned, the contacts for the connector are bottom-mounted in that they are pushed up into respective sockets within the connector housing. The tabs which are hot-pressed over the edges at the base of the contact prevent solder from contaminating the contact. Thus no additional sealing member need be applied to the bottom of the connector in view of the provision of the hot-pressed corner tabs. In a preferred embodiment, the tabs are triangular in cross-section, with the tips of the triangles being bent inwardly towards the centerline of the corresponding socket to perform both the sealing and contact-retaining functions.

With respect to the reverse-bend dual beam structure, it will be appreciated that the contact arms are spring-loaded one against the other at their free ends. The reverse-bend configuration reduces the height of the contact and therefore the thickness of the socket. This in turn reduces the seating plane height. Seating plane height is defined by the top surface of the socket in relationship to the top surface of the printed circuit board. Were the contact arms provided with the prior art upwardly flaired portions, the height of the top surface of the socket would be considerably increased.

Moreover, in the subject reverse-bend dual beam contact, because the force applied to an inserted pin between the two arms has both a lateral and a vertical component, better wiping action occurs when the pin is withdrawn from between the two contact arms. This wiping action is also increased becaused the contact depth is relatively shallow, which means that the length of inserted pin below the ends of the contact arms is increased over contacts having deeper contact points. This in turn translates into an increased length of pin wiping against the ends of the contacts to provide for increased wiping and cleaning action.

In one embodiment, the contacts for the socket are made in a folding operation in which the opposed beams are first cut and stamped in one plane, with one beam being folded first through 90° and then through another 90° into opposition with the other beam.

BRIEF DESCRIPTION OF THE DRAWINGS

These and other features of the invention will be better understood in connection with the detailed description taken in conjunction with the drawings in which.

DETAILED DESCRIPTION

Figure 1:
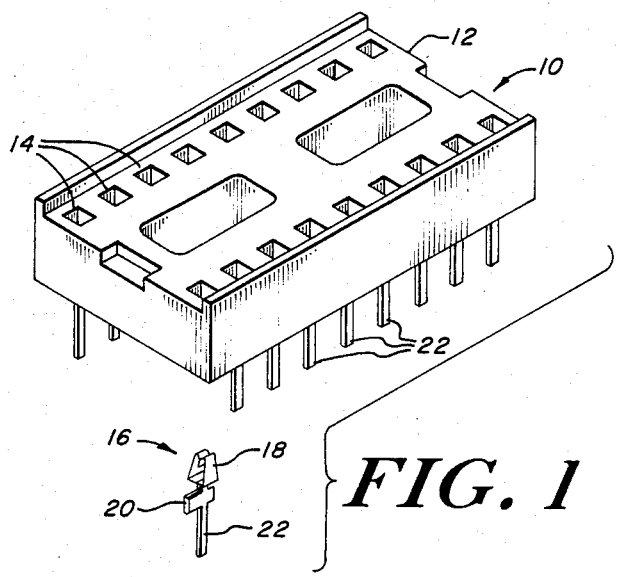
FIG. 1 is a diagrammatic illustration of the subject connector illustrating the insertion of a dual beam reverse-bend contact within a socket of the connector.

Referring now to FIG. 1, a DIP socket connector 10 includes a housing 12 having regularly arranged sockets 14 adapted to receive contacts 16. In the subject invention, each of the contacts includes a dual beam portion 18 including two opposed contact arms and a tab portion 20 projecting from a connector lead 22. The seating plane height mentioned hereinbefore is measured from top surface 24 of connector 10 to the top surface of a printed circuit board (not shown in this figure).

Figure 2:
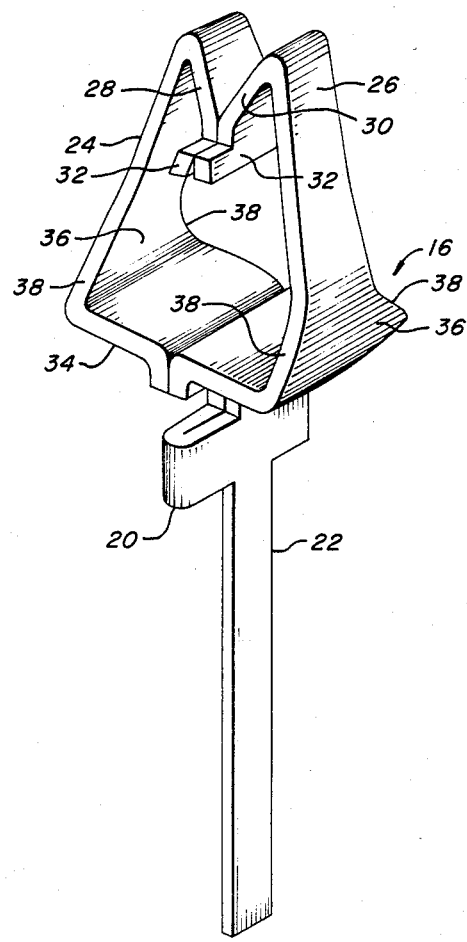
FIG. 2 is an isometric view of a contact for insertion into a socket in the subject connector of FIG. 1.

In one embodiment, contact 16 of FIG. 1 is shown in FIG. 2 to include two opposed beams 24 and 26 which have a reverse-bend 28 and 30 with anti-overstress means 32 mounted at the ends of these beams. Beams 24 and 26 are bent upwardly from a base 34 formed integrally with lead 22 which has tab 20 extending laterally therefrom. In the FIG. 2 embodiment, it will be appreciated that the dual beam contact is formed by bending a stamped piece 180° back on itself, such that beams 24 and 26 oppose each other, with the anti-overstress means and the ends of beams 24 and 26 abutting each other in a spring-loaded configuration.

It will be appreciated that the beams or contact arms of contact 16 have flaired portions 36 adjacent to base 34, with edges 38 of the flaired portions being sloped inwardly. When this contact is uploaded into the connector body, edges 38 of flaired portions 36 contact internal shoulders within the sockets 14 of connector body 12 to limit the upward movements of the contact. This type of mounting will be described hereinafter in connection with FIG. 6.

Figure 3:
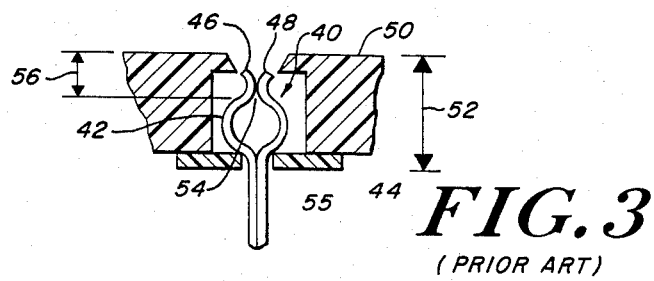
FIG. 3 is a diagrammatic and cross-sectional illustration of a U-shaped prior art contact.
Figure 4:
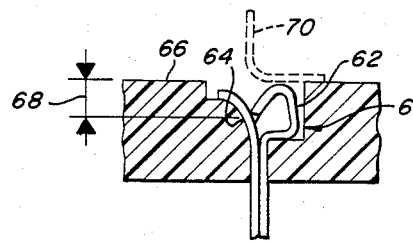
FIG. 4 is a cross-sectional and diagrammatic illustration of a prior art semi-dual beam contact.

Referring now to FIGS. 3 and 4, the prior art U-shaped contact and semi-dual beam contact are shown. With respect to FIG. 3, the aforementioned U-shaped dual beam contact is illustrated generally at 40 to include beams 42 and 44 having flaired portions 46 and 48, respectively. The height of the contact is in general established by the tops of the flaired portions which establishes surface 50 and thus the overall seating plane height of the connector as illustrated by double-ended arrow 52. This height of 0.200 compares with 0.170 for the subject connector. It will be noted that the contact depth illustrated by contact point 54 and double-ended arrow 56 is approximately the same as that of the subject device.

Referring to FIG. 4, a semi-dual beam contact 60 is illustrated with a reverse-bend beam 62 and a stationary beam 64. The seating plane height is defined by surface 66, and the depth of the contact is illustrated by the double-ended arrow 68. This depth is relatively deep, thereby minimizing the length of IC pin below the contact point, which in turn minimizes wiping action when the IC pin is withdrawn from the connector.

Because one of the beams is stationary, the downward and inward wiping action is accomplished only by beam 62 in a single-sided manner. It will also be appreciated that should a contact pin bend, as illustrated by dotted outline 70, it rests on top of the contact rather than moving into the area between the beams.

With respect to the wiping action in FIG. 3, it will be appreciated that the dual beams press inwardly on an inserted pin and exert only a perpendicular force on the inserted pin, as opposed to a downward and inward force produced by the ends of the reverse-bend beam portions of the arms of the contact of FIG. 2. Moreover, the contact height defined by the reverse-bent dual beam structure of FIG. 2 is less than the contact height for the structure of FIG. 3, or the structure of FIG. 4. Additionally, the contact depth of the contact in FIG. 2 is significantly shallower than the contact of FIG. 4. This permits increased wiping action since the portion of the inserted pin beneath the ends of the reverse-bent dual beams is considerably longer than the prior art connector of FIG. 4.

Figure 5:
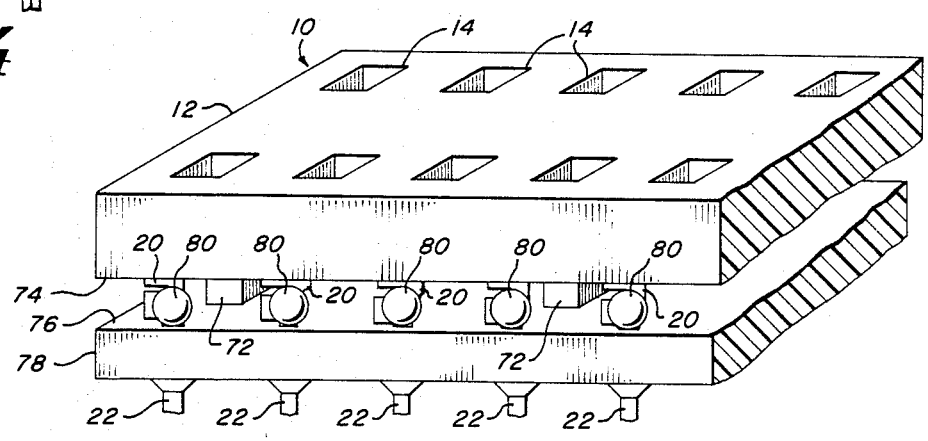
FIG. 5 is a diagrammatic illustration of the spacing of the subject connector from the top surface of a printed circuit board, also illustating the utilization of a tab to provide additional soldering reliability by virtue of the contact of solder bubbles on top of the printed circuit board with corresponding tabs.

Referring now to FIG. 5, contact body 12 is provided with downwardly depending spacers 72 which space the bottom 74 of connector body 12 from the top surface 76 of a printed circuit board 78. Leads 22 from the contacts in sockets 14 of connector 10 depend through so-called "through-holes" in the circuit board. Leads 22 are soldered to the circuit board from the underneath side, usually by a wave soldering technique, which results in solder bubbles 80 coming up through the through-holes in the printed circuit board, where they attach to tabs 20. This provides increased contact area because of the area of the tab, thereby increasing the reliability of the electrical connection between the connector and the circuit board.

Figure 6:
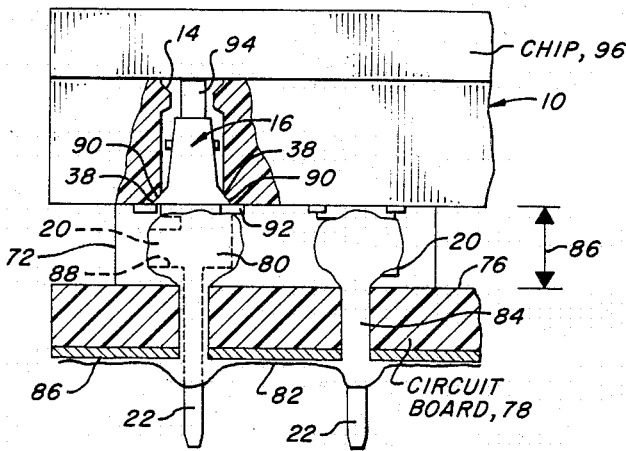
FIG. 6 is a more detailed cross-sectional diagrammatic illustration of the connector/printed circuit board configuration of FIG. 5.

This type of action is more clearly illustrated in FIG. 6. Here the wave soldering technique results in solder 82 flowing up through-holes 84 to produce solder bubbles 80 as illustrated. This electrically connects leads 22 to a conductive layer 86 on the underneath side of circuit board 78.

As can be seen, spacer 72 creates a standoff distance as illustrated by double-ended arrow 86, which ensures that the bottoms 88 of tabs 20 do not contact the top surface 76 of the printed circuit board.

The uploading of contact 16 is illustrated in connection with FIG. 6. In this figure, the dual beam structure is inserted up through socket 14 until such time as edges 38 contact seat 90 at the lower portion of socket 14. Contact 16 is maintained in place by hot-pressed, bent-over, heat-deformable tabs 92 which maintain the uploaded contact within connector 10, the tabs opposing the downward thrust of a pin 94 from an integrated circuit chip 96 when the chip is mounted into connector 10.

The mounting of the dual beam connector within the socket of the connector is also illustrated in connection with FIG. 7, in which like reference characters are utilized between FIGS. 1-6 and FIG. 7.

Figure 7:
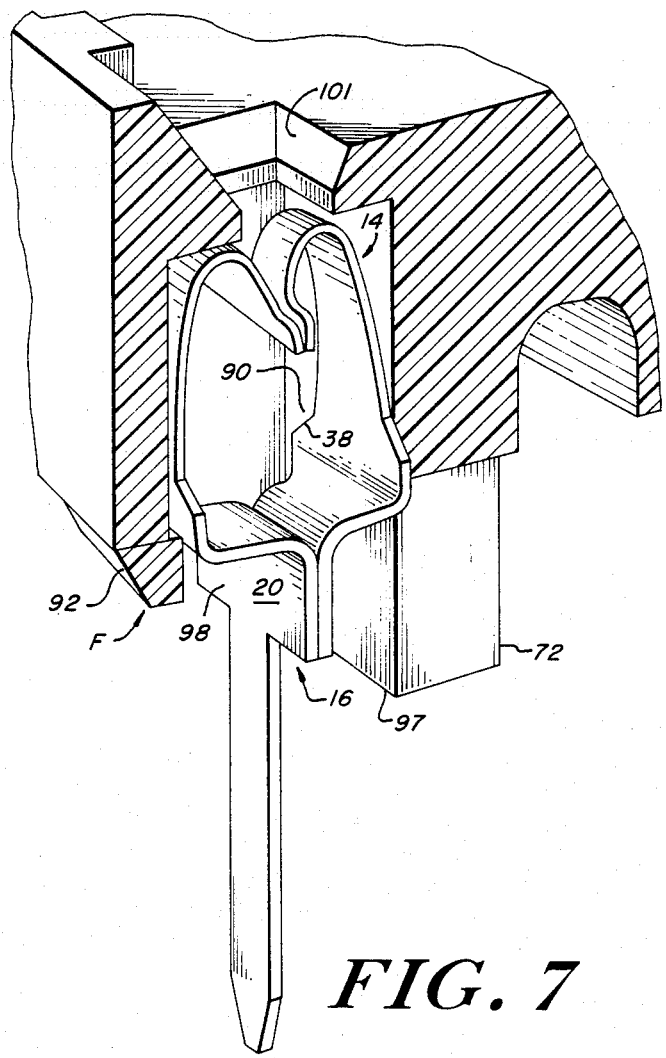
FIG. 7 is a cross-sectional and cutaway illustration of a portion of the subject connector, showing the insertion of a reverse-bend dual beam contact within a socket provided in a connector housing, also illustrating the connector housing standoff and deformable tab.

Referring now to FIG. 7, contact 16 is unploaded into socket 14 such that tab 20 depends downwardly but short of the bottom 97 of spacer 72.

In one embodiment, the seating plane height is 0.170 inches with 0.048 inches being added to the connector height by virtue of spacer 72. This total height, i.e., 0.170 inches, is lower than the seating plane height of the prior art connector illustrated in FIG. 3 and about the same as the seating plane height of the prior art connector illustrated in FIG. 4.

As can be seen, the upward travel of contact 16 in socket 14 is limited by integral seat 90 carried within socket 14 which coacts with edges 38 of the dual beam portion of the contact. The contact is sealed into the socket by virtue of hot-pressing the heat-deformable tab 92 inwardly as illustrated by arrow 98. Note that the top 99 of the connector housing is provided with a reduced size aperture 101 vertically adjacent the corresponding socket 14, with the side walls of the aperture being chamfered to guide an inserted pin to the contact. As can be seen, the apertured connector housing top covers the bent portions of the dual beam contact to prevent a bent IC pin from making electrical contact with the top of a contact.

Figure 8:
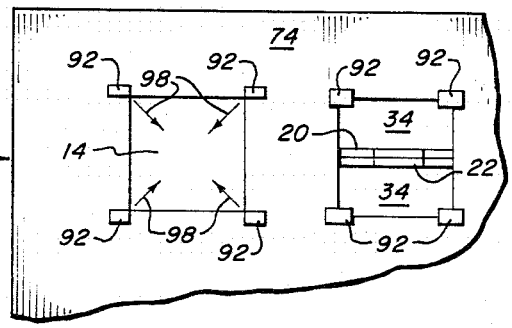
FIG. 8 is a bottom view of a portion of the connector of FIGS. 4–7 illustrating the positioning of deformable tabs at the corners of respective sockets, and the direction of the deforming force utilized in deforming the tabs over the orifice corresponding to the bottom of a socket.
Figure 9A:
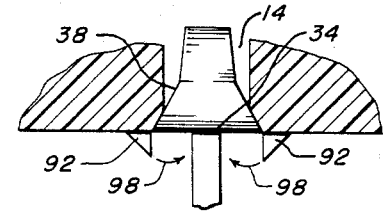
FIGS. 9A and 9B are cross-sectional and diagrammatic illustrations of the mounting of a contact within a socket carried by the subject connector, illustrating the action of the deformable tab.
Figure 9B:
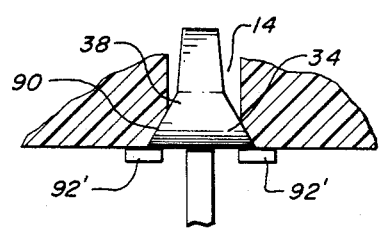

Referring to FIG. 8, bottom 74 of connector 10 is illustrated in which the placement of heat-deformable tabs 92 at the corners of socket 14 is depicted. When the tabs are bent over the base 34 of an inserted contact, the contact is sealed into the socket as illustrated in FIGS. 9A and 9B in which tabs 92, here illustrated originally being triangular in cross-section, are bent over as illustrated by arrows 98 such that base 34 is sealed to socket 14, as illustrated at 92' in FIG. 9B. Also note the flaired edges 38 abutting seat 90 in socket 14 to prevent the upward movement of the contacts.

It will be appreciated that the connector constructed with the reverse-bend dual beam contact, when utilizing the spacer, provides for an exceptionally stable and good electrical contact between the pins of inserted integrated circuits and a printed circuit board. The dual beam contact configuration provides shallow contact depth, increased wiping, and minimum seating plane height, while the tab on the contact lead provides increased solder area. The standoff permits cleaning of residual flux from the top of the printed circuit board and permits visual inspection of the solder joint to the tab, while at the same time preventing loading of the tab itself. The uploaded contact is sealed by virtue of heat-deformable tabs at the corners of the socket, which not only prevent the contacts from dropping out of the connector, but also seal the contacts to the connector housing, thereby preventing solder contamination of the contact.

Having above indicated a preferred embodiment of the present invention, it will occur to those skilled in the art that modifications and alternatives can be practiced within the spirit of the invention. It is accordingly intended to define the scope of the invention only as indicated in the following claims.

What is claimed is:

1. A connector for use with wave soldering, said connector having contacts with solder tabs on the leads thereof, which tabs are positioned above a printed circuit board, said printed circuit board having through-holes to accommodate said leads and to which said connector is mounted such that solder used to connect the leads to the board through-holes flows to the corresponding tabs for improved electrical contact between the connector contacts and respective printed circuit board through-holes, said connector including a housing which includes a number of sockets for receiving the pins of a mating connector, a number of contacts having coacting arms with flat portions for engaging opposite sides of said pins, said contacts being located in said sockets, each of said contacts having a lead which depends downwardly from the bottom surface of said housing, and a laterally running tab forming said solder tab, said laterally running tab being wider than the lead and folded on itself to form side by side tab portions in contact with each other and with each said tab portion running in the same direction as that of the flat portions of the corresponding coacting arms, said laterally running tab extending from said lead below the bottom surface of said housing, said housing having standoffs depending from the bottom surface thereof, said standoffs spacing the bottom of said laterally running tabs from the corresponding through-holes so as to permit the upflow of solder during wave soldering, such that when said connector is mounted to a printed circuit board having through-holes, the leads of said connector are inserted into corresponding through-holes, and with wave soldering, said connector leads are soldered to said printed circuit board, with solder extending through said through-holes and forming a solder bubble onto corresponding ones of said side by side tab portions of each laterally running tab.

* * * * *